United States Patent
Kennedy

(10) Patent No.: US 7,471,116 B2
(45) Date of Patent: Dec. 30, 2008

(54) DYNAMIC CONSTANT FOLDING OF A CIRCUIT

(75) Inventor: Irwin O. Kennedy, Londonderry (GB)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 343 days.

(21) Appl. No.: 11/297,198

(22) Filed: Dec. 8, 2005

(65) Prior Publication Data
US 2007/0136009 A1 Jun. 14, 2007

(51) Int. Cl.
*G01R 23/02* (2006.01)
*G06F 17/50* (2006.01)

(52) U.S. Cl. .............................. 327/46; 716/1
(58) Field of Classification Search ............... 716/1–2, 716/4; 327/39–40, 42, 46
See application file for complete search history.

(56) References Cited

U.S. PATENT DOCUMENTS

| | | | |
|---|---|---|---|
| 2003/0220119 A1 | 11/2003 | Terry | 455/466 |
| 2004/0152453 A1 | 8/2004 | Hayashi | 455/412.2 |

FOREIGN PATENT DOCUMENTS

| | | |
|---|---|---|
| WO | WO2004/051926 | 6/2004 |
| WO | WO2005/020520 | 3/2005 |

OTHER PUBLICATIONS

Kennedy, I. et al., "Design of a reconfigurable UMTS channel processing engine", May 17, 2004, IEEE, Vehicular technology conference, 2004, VTC, Spring 2004, vol. 3, pp. 1300-1304.*
Chapman, Ken, et al., "CDMA matched filter implementation in virtex devices", Jan. 10, 2001, Xilinx, XAPP212 (v1.1) obtained at http://www.xilinx.com/support/documentation/application_notes/xapp212.pdf.*
PCT Search Report from PCT/US2006/047163 dated Jun. 1, 2007.
Eusebio, P. et al., "Management Scenarios for Multicast Groups in Enhanced-UMTS" Vehicular Technology Conf., 2004. VTC2004-Fall. IEEE 60th Los Angeles, CA. USA Sep. 26-29, 2004, Piscataway, NJ, USA, IEEE Sep. 26, 2004, pp. 3045-3049, XP010787214, ISBN: 0-7803-8521-7.
"Universal Mobile Telecommunications System (UMTS)" ETSI Standards, European Telecommunications Standards Institute, Sophia-Antipo, FR, vol. 3-SA2, No. V680, Sep. 2005), XP014032473, ISSN: 0000-0001.

* cited by examiner

*Primary Examiner*—Stacy A Whitmore

(57) ABSTRACT

The present invention provides a method involving at least one first circuit having at least one first input, at least one second input, and at least one output. The method includes determining at least one first value of at least one output of a second circuit based on at least one first value of the at least one first input. The second circuit has been configured using first configuration information generated based on the first circuit and at least one first value of the at least one second input. The method also includes generating, concurrently with determining the at least one first value of said at least one output, second configuration information based on the first circuit and at least one second value of the at least one second input.

21 Claims, 9 Drawing Sheets

DYNAMIC CONSTANT FOLDING OF A CIRCUIT

BACKGROUND OF THE INVENTION

1. Field of the Invention

This invention relates generally to circuits, and, more particularly, to dynamic constant folding of circuits.

2. Description of the Related Art

Digital circuitry in modern computing devices is generally used to produce one or more output signals in response to one or more input signals. To take a very simple example, an AND gate receives two inputs that may correspond to a binary 1 or a binary 0. The output of the AND gate is a binary 1 if the two inputs are both either 1s or 0s and a binary 0 if the two inputs are different. More complicated circuits, such as processors, memory elements, application-specific integrated circuits, and the like may be formed by combining simple logical elements such as AND gates. The values of the inputs and/or outputs of digital circuits are typically evaluated in time with a clock. For example, the values of the outputs of a digital circuit may be determined based on the values of the inputs on a rising edge of a clock signal. Accordingly, the state of the digital circuit may change, or be allowed to change, at the clock frequency.

Although the overall state of the digital circuit typically varies with the clock frequency, some inputs to portions of the digital circuit may change at a frequency that is less than the clock frequency used to drive the digital circuit. In some cases, inputs to a portion of the digital circuit may remain unchanged largely by coincidence. However, in other cases, one or more inputs to a portion of the digital circuit may remain predictably constant over a time period that is larger than the clock period. Accordingly, the digital circuit may be simplified by assuming that the input is equal to the constant value for the number of clock cycles over which the input remains constant. When the input changes to a different constant value, the digital circuit may be correspondingly modified. Accordingly, the digital circuit may vary with a frequency equal to the frequency of variation of the input. Simplifying a digital circuit by assuming constant values of one or more inputs for a selected period of time is conventionally referred to as "constant folding."

FIG. 1 conceptually illustrates a conventional static implementation of a circuit 100 and a constant-folded circuit 105 corresponding to the circuit 100. The circuit 100 receives inputs A and B and produces a corresponding output C. Input A is assumed to vary at the clock frequency and input B varies at a frequency that is less than the clock frequency. Accordingly, the circuit 100 remains static and the output C of the circuit 100 varies at the clock frequency. The constant-folded circuit 105 receives input A, performs the same operations on the input A as are performed by the circuit 100 for a selected constant value of the input B, and produces a corresponding output C. However, since the input B varies at a frequency that is less than the clock frequency, the output C of the constant-folded circuit 105 also varies at the frequency of the input B.

The structure of the constant-folded circuit 105 is typically determined by information included in an active configuration memory. The contents of the active configuration memory may be varied to change the structure of the constant-folded circuit 105 to correspond to different values of the constant inputs B. For example, the constant-folded circuit 105 may be implemented as a Field Programmable Gate Array (FPGA) and the inputs to the FPGA lookup table may be stored in the active configuration memory. The structure of the constant-folded circuit 105 may be varied at the frequency of the input B by providing new information to the active configuration memory at the frequency associated with the input B. For example, different programming inputs responding to different values of the input B may be generated at design-time (i.e., statically) and stored by the system. The stored programming inputs may then be provided to the active configuration memory at the frequency associated with the input B. However, static generation and storage of constant folded system configurations limits the applicability of reconfiguration. For example, the cost of storage can be prohibitive if the number of different constant values is large. In addition, if configurations are stored off-chip, the I/O bandwidth required to load them on demand may be prohibitively large.

Reconfiguring the constant-folded circuit 105 during operation may result in spurious outputs, which may be propagated to the rest of the system. Consequently, conventional constant-folding requires that the constant-folded circuit 105 halt computation during the reconfiguration process in order to isolate the unknown transitory state of the constant-folded circuit 105 from target areas that may receive the spurious results produced during the reconfiguration. For example, computation may be halted by pruning the system clock, setting the target areas equal to constants for the duration of the reconfiguration process, or setting a reconfiguration flag.

Halting computation results in downtime for the computational fabric that includes the constant-folded circuitry, regardless of the particular technique used to halt computation. The downtime may be amortized over computation time by restricting reconfiguration to inputs that change relatively infrequently when compared to the system clock frequency. However, restricting constant folding to variables that change relatively infrequently limits the number of instances in which constant folding may be applied. Alternatively, the computational fabric downtime may be reduced by providing chip-level architectural features that enable rapid reconfiguration speeds. However, the chip level architectural features consume valuable die area and may result in a reduction in performance of circuits on the chip, which may reduce the number of applications of the computational fabric.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided involving at least one first circuit having at least one first input, at least one second input, and at least one output. The method includes determining at least one first value of at least one output of a second circuit based on at least one first value of the at least one first input. The second circuit has been configured using first configuration information generated based on the first circuit and at least one first value of the at least one second input. The method also includes generating, concurrently with determining the at least one first value of said at least one output, second configuration information based on the first circuit and at least one second value of the at least one second input.

In another embodiment of the present invention, a method is provided involving a matched filter comprising at least one correlator configured to correlate a portion of a code sequence with portions of a data stream. The method includes determining at least one first correlation value based on the portion of the code sequence and a first portion of the data stream using the correlator. The correlator has been configured using first configuration information generated based on the first portion of the data stream. The method also includes generating, concurrently with determining the at least one first correlation value, second configuration information based on a second portion of the data stream.

BRIEF DESCRIPTION OF THE DRAWINGS

The invention may be understood by reference to the following description taken in conjunction with the accompanying drawings, in which like reference numerals identify like elements, and in which.

Figure 1:
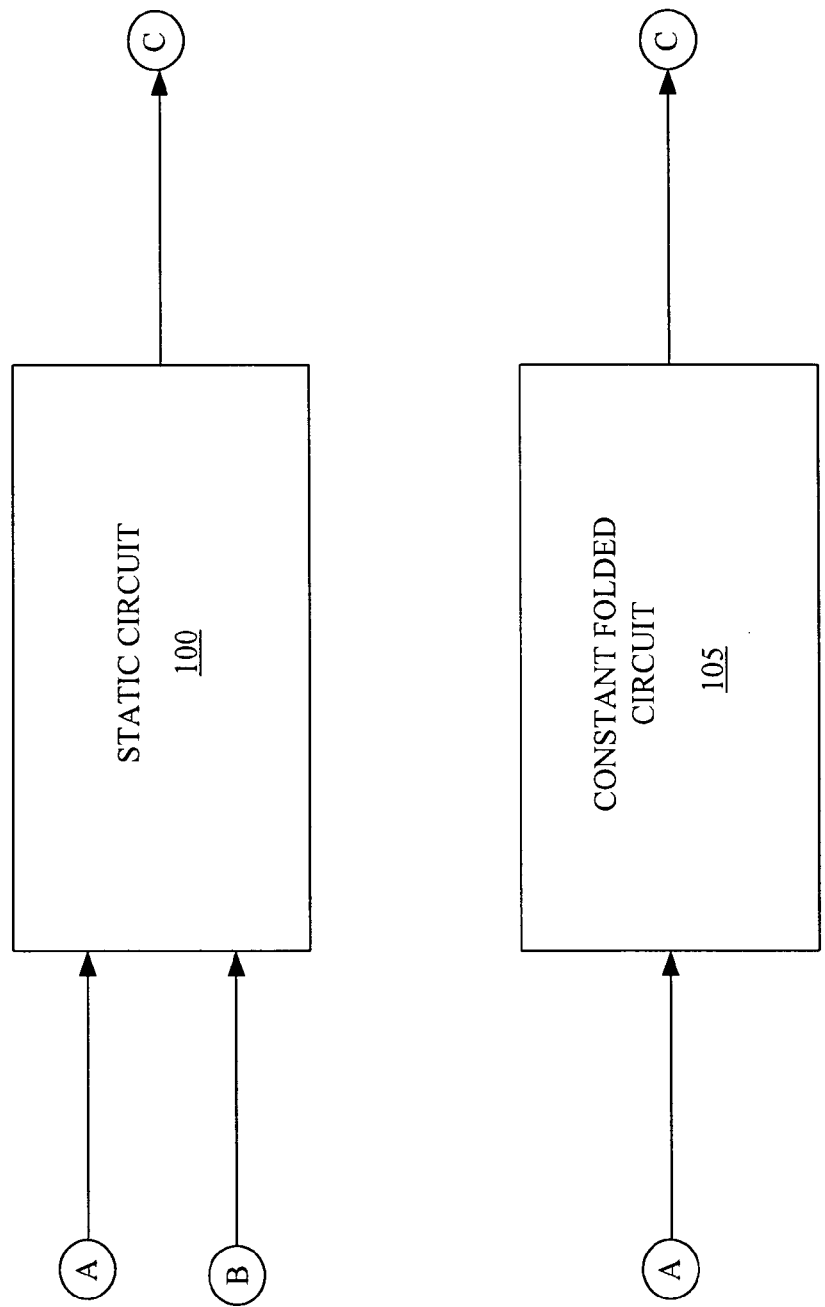
FIG. 1 conceptually illustrates a conventional static implementation of a circuit and a conventional constant-folded circuit corresponding to the static implementation of the circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
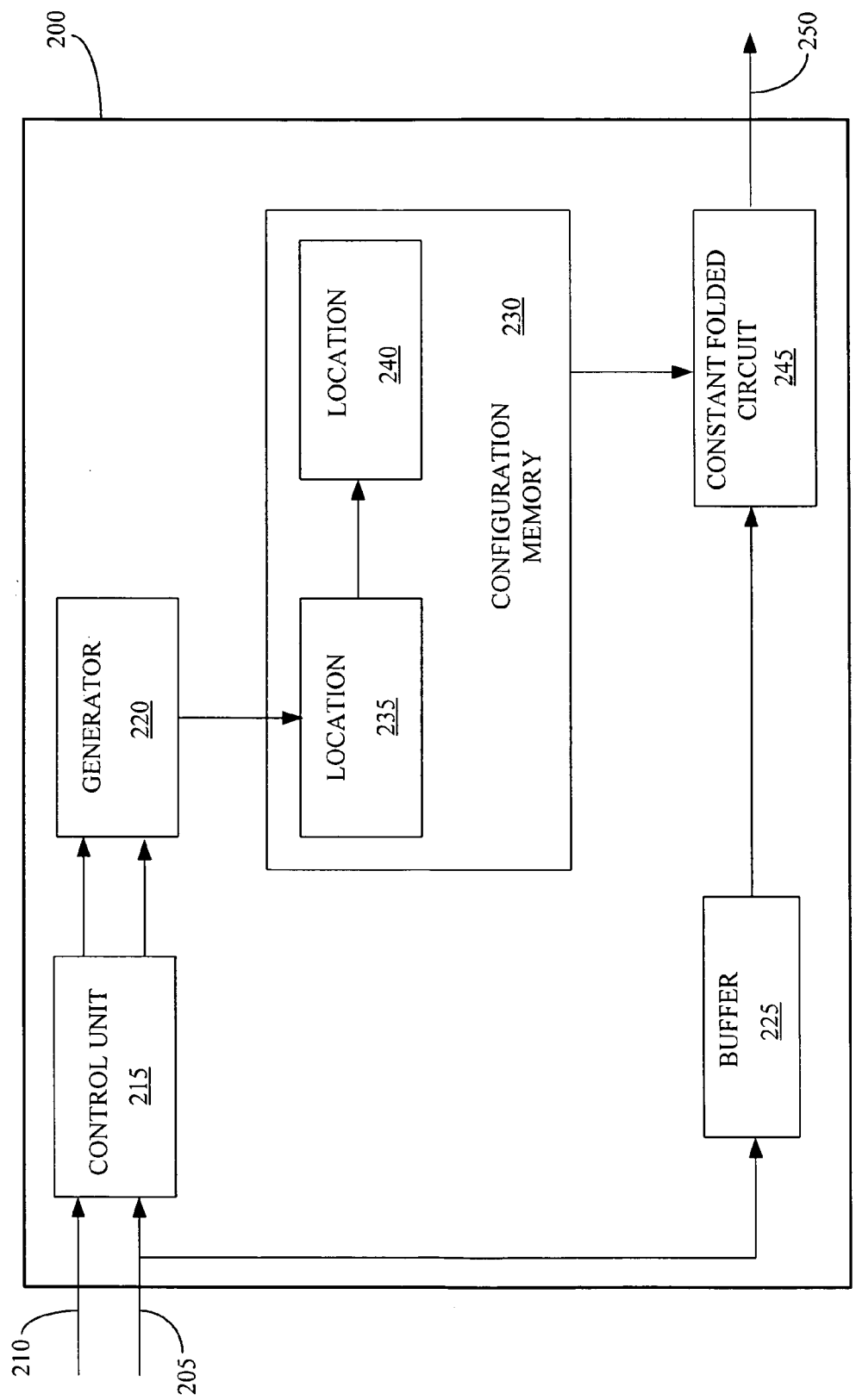
FIG. 2 conceptually illustrates one exemplary embodiment of a system, in accordance with the present invention.

FIG. 2 conceptually illustrates one exemplary embodiment of a system 200. An illustrative embodiment, the system 200 receives one or more dynamic inputs 205 and one or more constant inputs 210. As used herein, the terms "dynamic" and "constant" will be understood to refer to a relative rate at which the values asserted at the dynamic inputs 205 and the constant inputs 210 change or are expected to change. The values asserted that the dynamic inputs 205 are expected to change at a rate that is faster than the rate of change of the values asserted that the constant inputs 210. Thus, the term "constant" is intended to imply that the values asserted at the constant inputs 210 remain approximately constant over a time period that is longer than the time period during which the values asserted that the dynamic inputs 205 may change. For example, the values asserted that the dynamic inputs 205 may vary at a clock frequency associated with the system 200 and the values asserted at the constant inputs 210 may vary at a frequency that is less than the clock frequency. However, the term "constant" is not intended to imply that the values asserted that the constant inputs 210 never change, although in some embodiments one or more of the values asserted at one or more of the constant inputs 210 may not change while the system 200 is in operation.

In the illustrated embodiment, the values asserted at the constant inputs 210 are provided to a control unit 215, which may provide the values asserted at the constant inputs 210 to a generator 220. The control unit 215 may also provide information indicative of values that may be asserted at the dynamic inputs 215 during a time period over which the values asserted at the constant inputs 210 are expected to remain constant. In the illustrated embodiment, the control unit 215 receives the values asserted at the dynamic inputs 205 and may provide these values, or information indicative thereof, to the generator 220. The values asserted at the dynamic inputs 205 may also be provided to a buffer 225, which may store these values for a predetermined time period, thereby adding latency to the system 200. However, persons of ordinary skill in the art having benefit of the present disclosure should appreciate that the present invention is not limited to embodiments in which the values asserted at the dynamic inputs 205 are provided to the control unit 215 and/or the generator 220. In one alternative embodiment, the control unit 215 may not receive the values asserted at the dynamic inputs 205 and instead may form information that may indicate the values that may be asserted at the dynamic inputs 205. For example, the values asserted at the dynamic inputs 205 may include pseudorandom information. The control unit 215 may therefore look ahead and predict the pseudorandom values that may be asserted at the dynamic inputs 205. The predicted values may then be provided to the generator 220.

The generator 220 is a circuit that may be used to generate configuration information that indicates the values of one or more outputs based on the values asserted at the constant inputs 210 and the values that are, or may be, asserted at the dynamic inputs 205. Persons of ordinary skill in the art having benefit of the present disclosure should appreciate that the generator 220 may correspond to any circuit and so the present invention is not limited to any particular implementation of the generator 220. In one embodiment, the generator 220 determines values of the outputs for each combination of values asserted at the constant inputs 210 and each of the values that are, or maybe, asserted at the dynamic inputs 205. For example, if the generator 220 corresponds to a circuit comprised of a single AND gate and the value asserted at a constant input to the AND gate is a binary 1, then the generator 220 may determine a binary 1 associated with a dynamic input value of binary 1 and a binary 0 associated with a dynamic input value of binary 0. In one embodiment, the configuration information determined by the generator 220 may be provided in the form of a lookup table. For example, values of the outputs determined by the generator 220 using the values asserted at the constant inputs 210 may be stored in the lookup table and addressed using the values asserted at the dynamic inputs 205.

The configuration information determined by the generator 220 may be stored in a configuration memory 230. In the illustrated embodiment, the configuration information is stored in a location 235 in the configuration memory 230. For example, a lookup table determined by the generator 220 may be stored in the location 235. Previously determined configuration information may also be stored in a location 240 in the configuration memory 230. Accordingly, the configuration information stored in the location 235 may be shifted into the location 240, as will be discussed in detail below. The configuration information stored by the configuration memory 230 may be provided to a constant-folded circuit 245. For example, a lookup table stored in the location 240 may be provided to the constant-folded circuit 245.

The constant-folded circuit 245 may determine one or more values of an output 250 using the values asserted at the dynamic inputs 205 and the configuration information determined by the generator 220. In one embodiment, the constant-folded circuit 245 is a Field Programmable Gate Array (FPGA) that may determine one or more values of the output 250 using the values asserted at the dynamic inputs 205 and the configuration information determined by the generator 220. For example, the constant-folded circuit 245 may be a lookup-table-based Field Programmable Gate Array (FPGA) that may determine one or more values of the output 250 by using the values asserted at the dynamic inputs 205 to address a lookup table determined by the generator 220.

The configuration information supplied to the constant-folded circuit 245 may be stored in the location 240. Accordingly, the generator 220 may generate configuration information associated with a different set of values that may be asserted at the constant inputs 210 while the constant-folded circuit 245 is determining the one or more values of the output 250 using the values asserted at the dynamic inputs 205 and the configuration information stored in the location 240. The configuration information that is generated concurrently with the operation of the constant-folded circuit 245 may be stored in the location 235 for later use by the constant-folded circuit 245, as will be discussed in detail below. Since the generator 220 can generate configuration information concurrently with operation of the constant-folded circuit 245, constant folding may be performed in the system 200 without halting competition by the system 200. In one embodiment, the locations 235, 240 may correspond to different memory planes.

Figure 3:
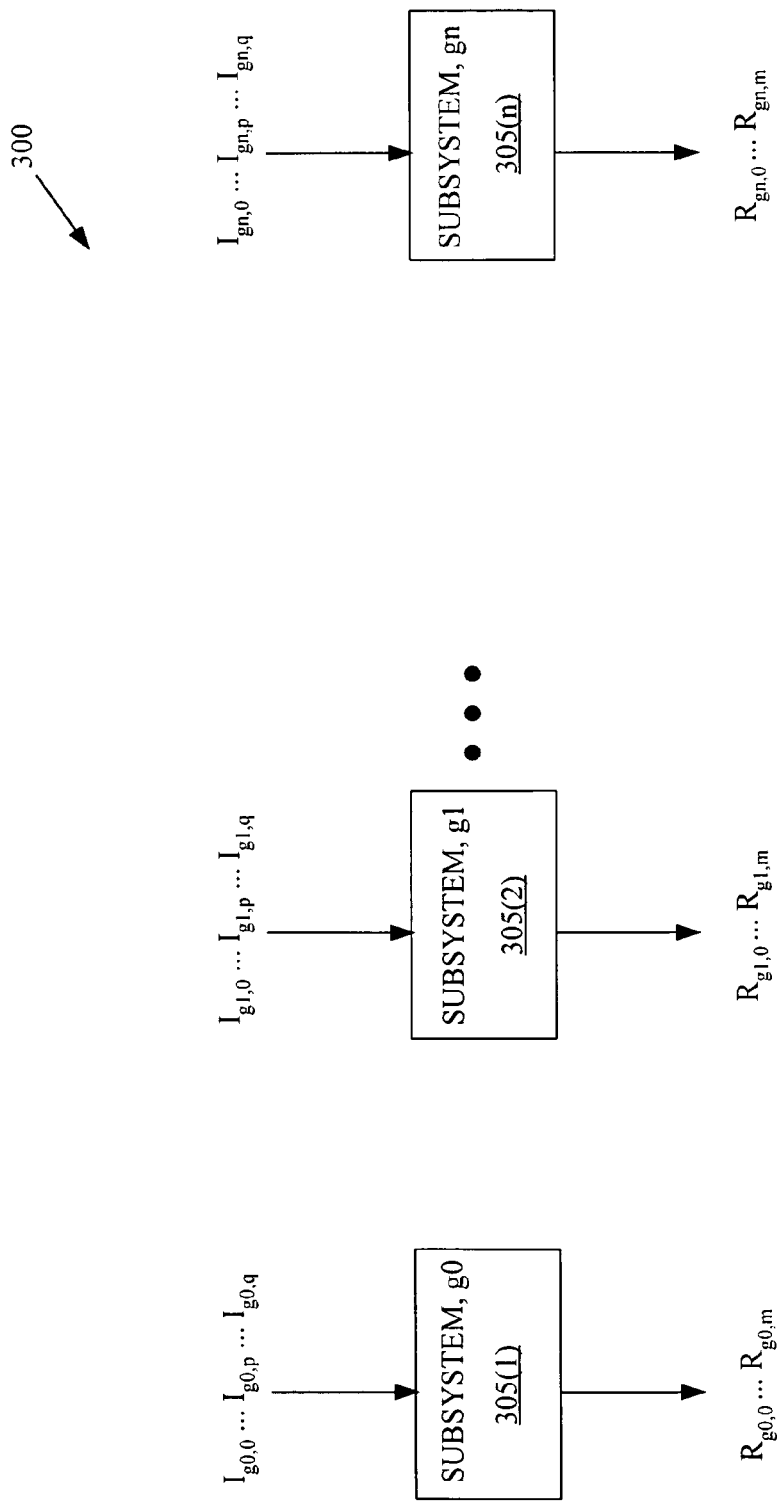
FIG. 3 conceptually illustrates one exemplary embodiment of a static system, in accordance with the present invention.

FIG. 3 conceptually illustrates one exemplary embodiment of a static system 300. In the illustrated embodiment, the static system 300 includes a plurality of subsystems 305(1-n). The indices (1-n) will be used herein to indicate individual subsystems 305(1-n) or subsets of the subsystems 305(1-n). However, in the interest of clarity, these indices may be dropped when the subsystems 305 are referred to collectively. This convention will be used when referring to any group of elements associated with a single identifying number and a plurality of indices. The subsystems 305 are also associated with the indicators g0 . . . gn. In the illustrated embodiment, the static system 300 may be implemented (in part) by connecting together a number of identical subsystems 305. However, persons of ordinary skill in the art having benefit of the present disclosure should appreciate that the static system 300 may not necessarily include identical subsystems 305 and may also include other subsystems or other circuitry not shown in FIG. 3. The connections between subsystems, their function, and any additional circuitry are also omitted for clarity in FIG. 3.

Each subsystem 305 in the static system 300 has a set of inputs, I, numbered 0 . . . q. In the illustrated embodiment, the inputs 0 . . . p have a high transition frequency and are not considered for folding. Thus, the inputs 0 . . . p may be considered dynamic inputs. The inputs p+1 . . . q have a low transition frequency (relative to the system clock) and are chosen for folding. Thus, the inputs p+1 . . . q may be considered constant inputs. The subsystems 305 in the static system 300 may produce a set of subsystem outputs, R, which are numbered 0 . . . m. In one embodiment, the subsystems 305 may be part of a lookup-table-based computational fabric, such as an FPGA.

Figure 4:
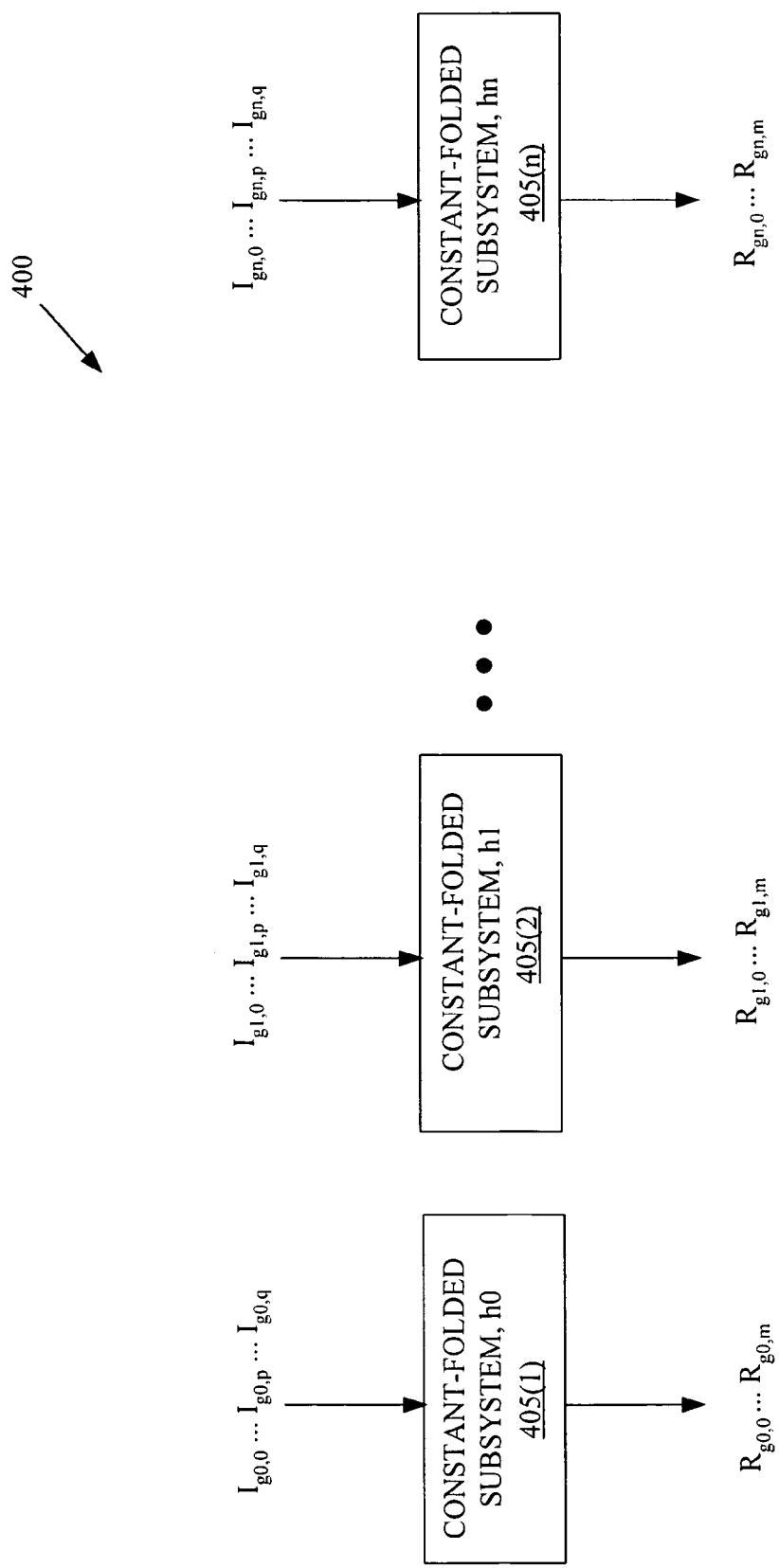
FIG. 4 conceptually illustrates one exemplary embodiment of a constant-folded system, in accordance with the present invention.

FIG. 4 conceptually illustrates one exemplary embodiment of a constant-folded system 400. The implementation of each subsystem g0 . . . gn shown in FIG. 3 has been replaced by a constant-folded subsystem 405, which are also labeled h0 . . . hn. The output of each constant-folded subsystem 405 is the same as the output of the corresponding subsystem 305. The set of inputs to each constant-folded subsystem 405 is reduced due to the constant folding and so the inputs I have the indices 0 . . . p. In one embodiment, the constant-folded subsystems 405 are implemented as a large lookup table (LLUT). However, persons of ordinary skill in the art having benefit of the present disclosure should appreciate that the present invention is not limited to lookup table implementations. In alternative embodiments, any memory content representative of the constant-folded system 400 may be used.

The LLUT contents may be changed at the maximum frequency of change of the constant inputs p+1 . . . q and a generator function may be used to populate the LLUTs at runtime, as discussed above. Access to the LLUT contents may be via a local interface such as the Xilinx SRL 16 primitive. Accordingly, the system 400 can be in operation using the LLUT for a set of values $B_i$ of constant inputs p+1 . . . q while the generator function populates the LLUT for a different set of values $B_{i+1}$ of the constant inputs p+1 . . . q. This removes the need to halt computation when the active constant values change to $B_{i+1}$ since all that is required is to read from the LLUT at a different address offset. The address offset is a matter of design choice that may be dependent on the implementation fabric. For an FPGA constructed from 4-input look-up tables and populated with a new constant at runtime via a serial shift-register mechanism (e.g. SRL16), the offset involves manipulating the LUT inputs as each bit of new content is shifted in. This may be necessary to preserve the relationship between the LUT input and the bit accessed in the table.

Figure 5:
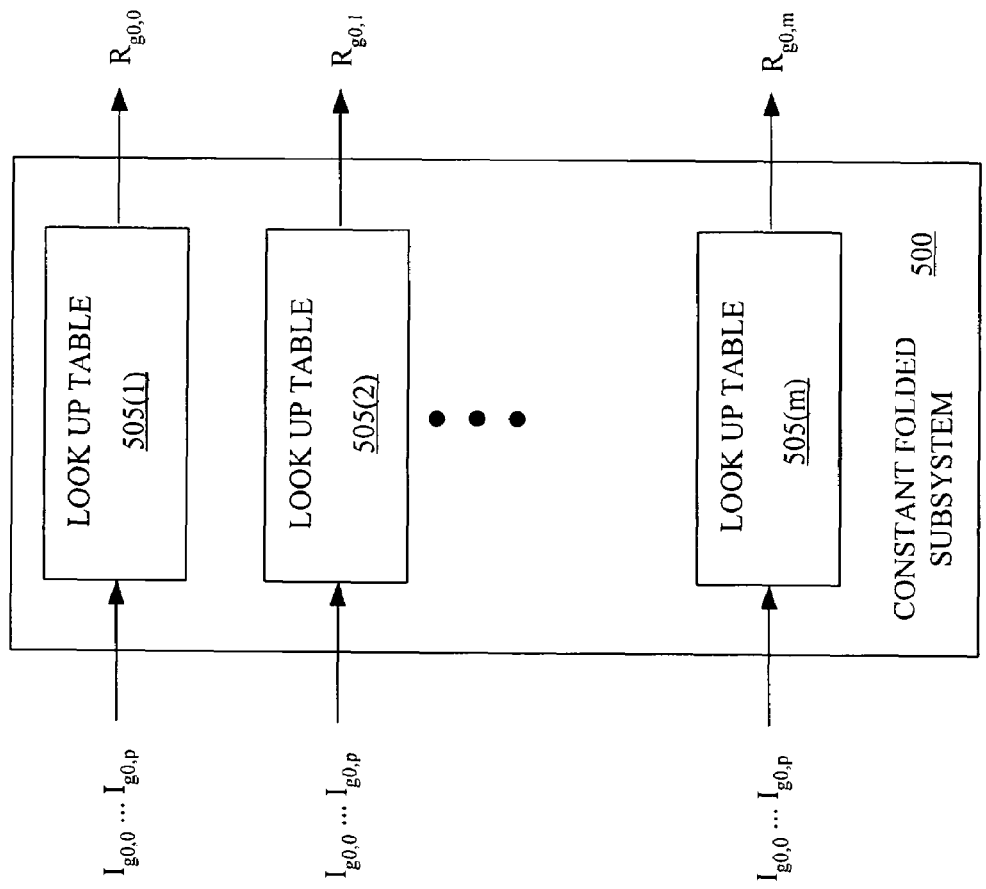
FIG. 5 conceptually illustrates one exemplary embodiment of a constant-folded subsystem, in accordance with the present invention.

FIG. 5 conceptually illustrates one exemplary embodiment of a constant-folded subsystem 500. For example, the constant-folded subsystem 500 may be an FPGA-targeted implementation of one of the constant-folded subsystems 405 shown in FIG. 4. In the illustrated embodiment, each output $R_0$ . . . $R_m$ is produced by performing a table lookup using the corresponding lookup table 505(1-m). The inputs to the lookup tables 505 are the values of the inputs 0 . . . p. However, persons of ordinary skill in the art having benefit of the present disclosure should appreciate that any number of lookup tables 505 may be used and that the number of lookup tables 505 may not correspond to the number of outputs $R_0$ . . . $R_m$. For example, if the number of inputs to an FPGA implementation of the subsystem 500 is greater than 4, then more than one 4-bit lookup table 505 may be required to produce each output. For another example, one or more lookup tables 505 having more than 4 input bits may be used.

The constant function performed by the lookup tables 505 may be replaced at approximately the frequency at which the constant subset of inputs changes. This may be done using an implementation of the subsystem 305 shown in FIG. 3 to cycle through all possible dynamic inputs 0 . . . p with the values asserted at the constant inputs p+1 . . . q. Each result produced by the subsystem 305 may then be loaded into the lookup tables 505. For example, each output bit may be loaded into a location in the lookup tables 505 associated with the dynamic input used to for the output bit such that when the dynamic input is applied, the output stored at the selected location in the lookup table 505 is produced. When all possible outputs have been written to the lookup table 505, the reconfiguration sequence is complete. The subsystem 305 may then supply the LUT contents for another subsystem 405, 500 by supplying the appropriate values of the constant inputs p+1 . . . q and again cycling through all possible values of the dynamic inputs 0 . . . p.

In one embodiment, the mechanism for loading the new content can be a 1-bit shift register such as the SRL16 functionality of the Xilinx Virtex family of devices. In the SRL16 mode, the 16-bit content of the lookup table 505 behaves like a shift-register. A special input pin supplies new input and a write-enable pin determines whether to shift. When the write-enable pin is high and a clock transition occurs, the content of the shift-register moves by one position, with location 0 now containing the new input and the old content of position 15 is lost, being overwritten by position 14. When shifting in new content, the inputs to the lookup table 505 may be adjusted. For example, supplying binary input 0000 after a number of shifts will produce the most recently loaded new content instead of the present constant content at location 0. To account for this, the inputs to the lookup table 505 may be dynamically adjusted. Without multiple context lookup tables 505 on the FPGA, the maximum number of dynamic inputs that can be supported is equal to half the number of inputs on the lookup table 505. Otherwise, the old content is shifted out of the lookup table 505 during reconfiguration and is not available for the present computation. With multiple context lookup tables 505 on the FPGA, the number of dynamic inputs may not be constrained as in the single context case. Computation may continue using one context while new configuration data is loaded into a second context. At the time of constant switchover the second context becomes the active context.

Figure 6:
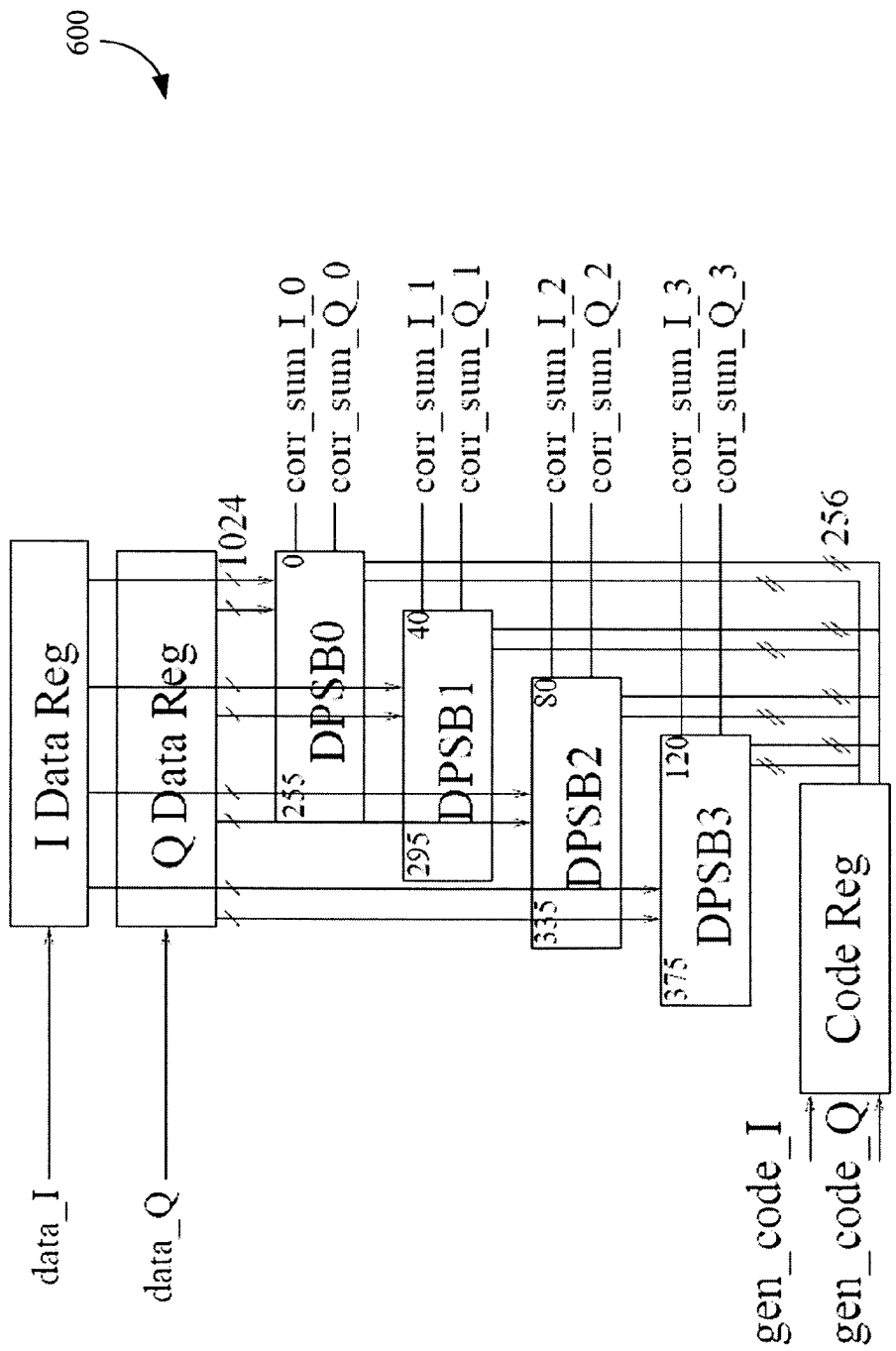
FIG. 6 conceptually illustrates one exemplary embodiment of a matched filter, in accordance with the present invention.

FIG. 6 conceptually illustrates one exemplary embodiment of a matched filter 600. Matched filters 600 are used extensively in Code Division Multiple Access (CDMA) communication systems such as the Universal Mobile Telecommunication System (UMTS). All mobile units in a UMTS cell use the same frequency spectrum. To allow discrimination between the different units, each transmits a unique code sequence. UMTS cellular base stations must be able to detect these different code sequences to distinguish between transmissions. This may be accomplished using the matched filter 600, which outputs a value indicating when the code sequence is matched in the input stream. A high value indicates a good match. Accordingly, in the illustrated embodiment, a matched filter 600 is a UMTS multiple-channel complex code matched filter (CCMF) 600. However, persons of ordinary skill in the art should appreciate that the present invention is not limited to the CCMF 600 and, in alternative embodiments, any matched filter 600 may be used.

In CDMA, a chip refers to a binary digit at the physical layer. When searching for a match, the correlation between the code and the data-stream is performed at consecutive chip offsets, referred to as the search window. In UMTS there are 3.84 million chips per second. The correlator(s) in the matched filters 600 may therefore be capable of processing a maximum 32-call load supported by the engine. Each of the four sample feeds for a call may be searched over a window size of 160 chips. With a clock rate of 153.6 MHz there are 40 cycles available per chip. The matched filter 600 performs the correlation between the expected code sequence and the incoming data streams of two sources, one 256-chip symbol at a time. The incoming data-streams are 2× over-sampled, producing 4 data different streams to be correlated against.

In the illustrated embodiment, the code is stored in a code register (CODE REG), which may include two 256-bit registers. The data is stored in the two registers at the top of the diagram, one for the real part (I Data Reg) and one for the imaginary part (Q Data Reg). Each data-register is 415-word data shift register, where each word is a 4-bit sample of a chip. Only the right-most 376 words of the data registers are output to the dot-product sub-blocks (DPSBs) as a 376 word-vector. The remaining 39 words may be shifted over until they reach the output. The DPSB0 takes words 0-255 as its inputs and computes the results for hypotheses 0-39, one per clock cycle. The DPSB3 takes words 120-275 as its inputs and computes the results for hypotheses 120-159. Thus, approximately 40 clock cycles may be used to compute the 160 hypotheses for a source component. After approximately 160 clock cycles, all hypotheses for the four sources may be computed.

Figure 7:
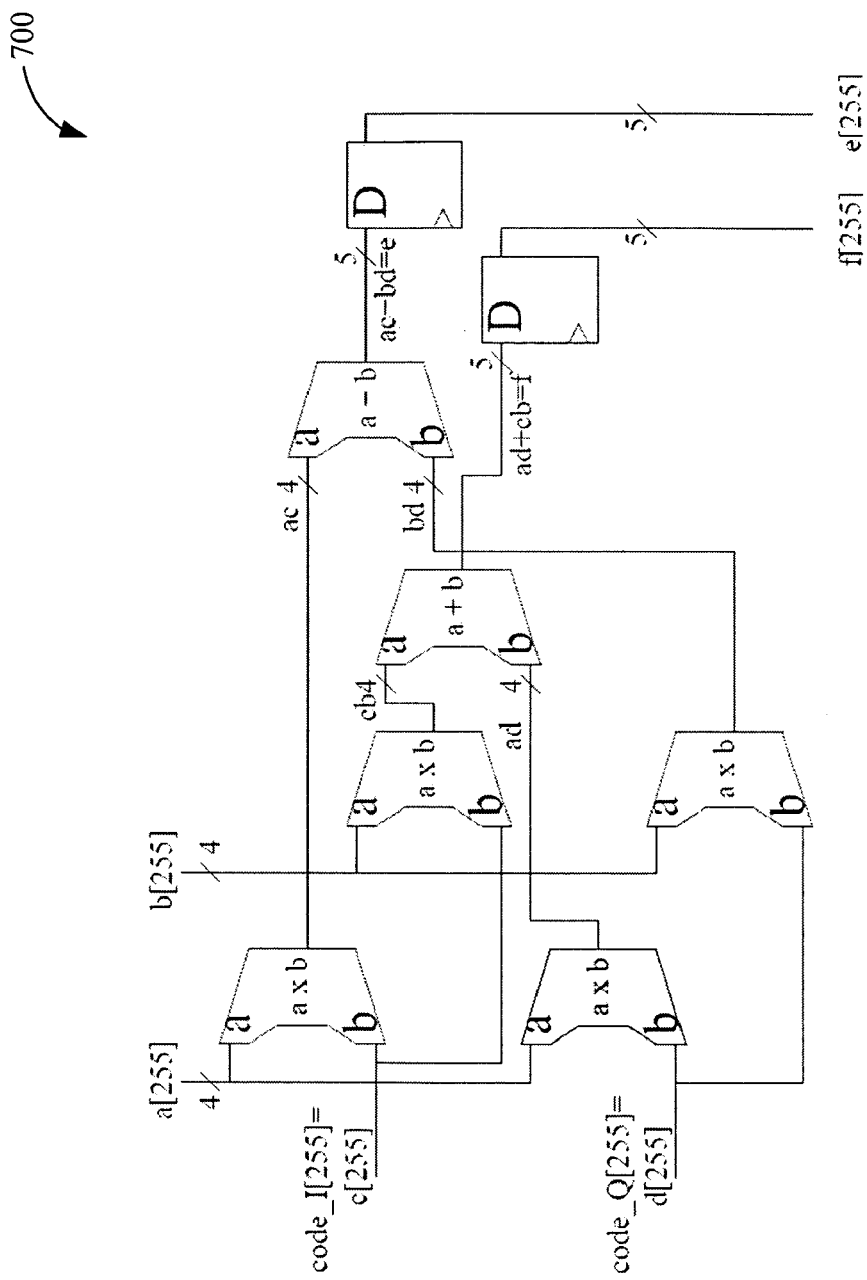
FIG. 7 conceptually illustrates one exemplary embodiment of a correlator, in accordance with the present invention.

FIG. 7 conceptually illustrates one exemplary embodiment of a correlator 700 that may be used to perform the correlations associated with each of the 256 positions of the DPSBs shown in FIG. 6. In the illustrated embodiment, a 10-bit input produces a 10-bit output. The correlator 700 may multiply the complex conjugate of the locally generated code by the complex data sample. Each DPSB shown in FIG. 6 may be constructed from 256 identical generator cells implementing the correlation function computed by the correlator 700.

The constant-folded (data-folded) implementation of the correlator 700 recognizes that the data stream stays constant over the 40-cycle search window. Therefore, the opportunity exists to reduce the number of computations to perform the correlation. With the data folded into the correlators 700, their dynamic input may be reduced to only 2 bits and the output remains 10 bits. Each of the output bits can be produced using a single 4-bit LUT. In one embodiment, only half the LUT is used and the new configuration corresponding to the next constant can be shifted into the LUT in parallel to computation, as discussed above. For a generator associated with the correlator 700 to compute all four code values for a data-item requires 4 clock cycles. With a 40-cycle reconfiguration period and 4 cycles per data-item, 10 data items can share a generator. To calculate the configuration for all 415 data items may require 42 generator units. The constant-folded cell corresponding to the correlator 700 may consist of 10 SRL16 enabled LUTs and an adder to adjust the code input. Additional control circuitry may be provided to produce a chip enable signal for shifting-in the new configuration at the correct 4-cycle window. In a cluster of cells that share the same generator unit, the CE signal can be produced using a single SRL16 LUT acting as a 4-bit shift register.

Figure 8:
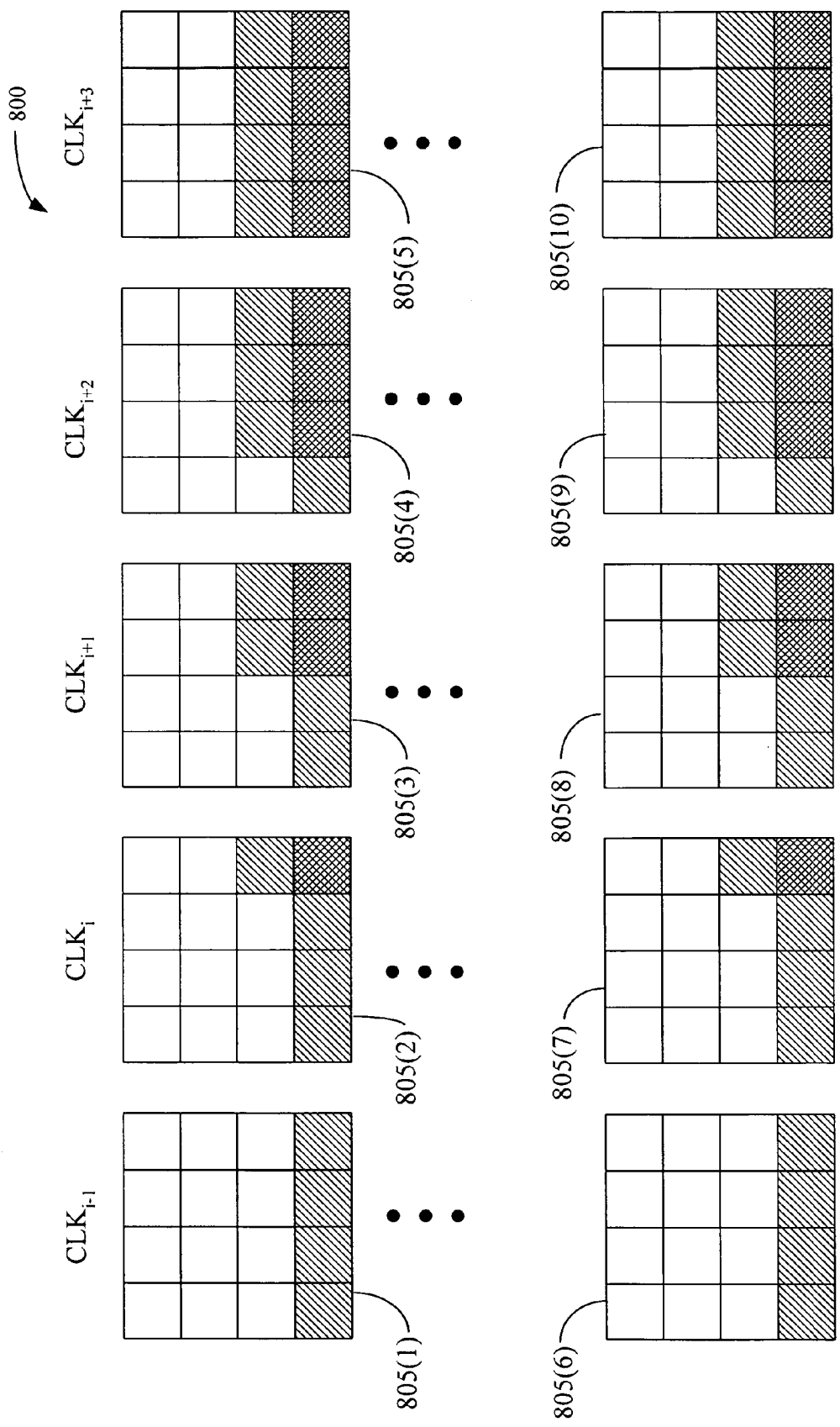
FIG. 8 conceptually illustrates one exemplary embodiment of a reconfiguration sequence for a constant-folded cell, in accordance with the present invention.

FIG. 8 conceptually illustrates one exemplary embodiment of a reconfiguration sequence 800 for a constant-folded cell. The contents of 10 SRL16 instantiated LUTs 805(1-10) are shown at 5 consecutive clock cycles. At $CLK_{i-1}$, only the bottom four locations of the SRL16s 800(1), 800(6) are occupied. In one embodiment, this may be a state unique to power-on-reset. In other embodiments and or at other times, old configuration data that has been shifted out of the bottom row may occupy the upper locations. At $CLK_{i-1}$, the cell's chip-enable signal goes high. This results in the SRL16s 800 loading whatever is on their shift-register input pin into the first memory-bit and shifting the existing content further into the LUT 800 by 1-bit. The input pin of the 10 SRL16s 800 is driven by the 10-bit output of an associated generator unit. The signal associated with $CLK_i$ loads the configuration for code "11", the signal associated with $CLK_{i+1}$ loads the configuration for code "10" and so on. At $CLK_{i+3}$, the CE signal goes low as reconfiguration is complete. The LUT input is adjusted to deal with the shifting memory content. Since the code provides the input to all LUTs 800 in the cell, the small cost of the adjustment circuitry may be amortized across the whole cell.

Figure 9:
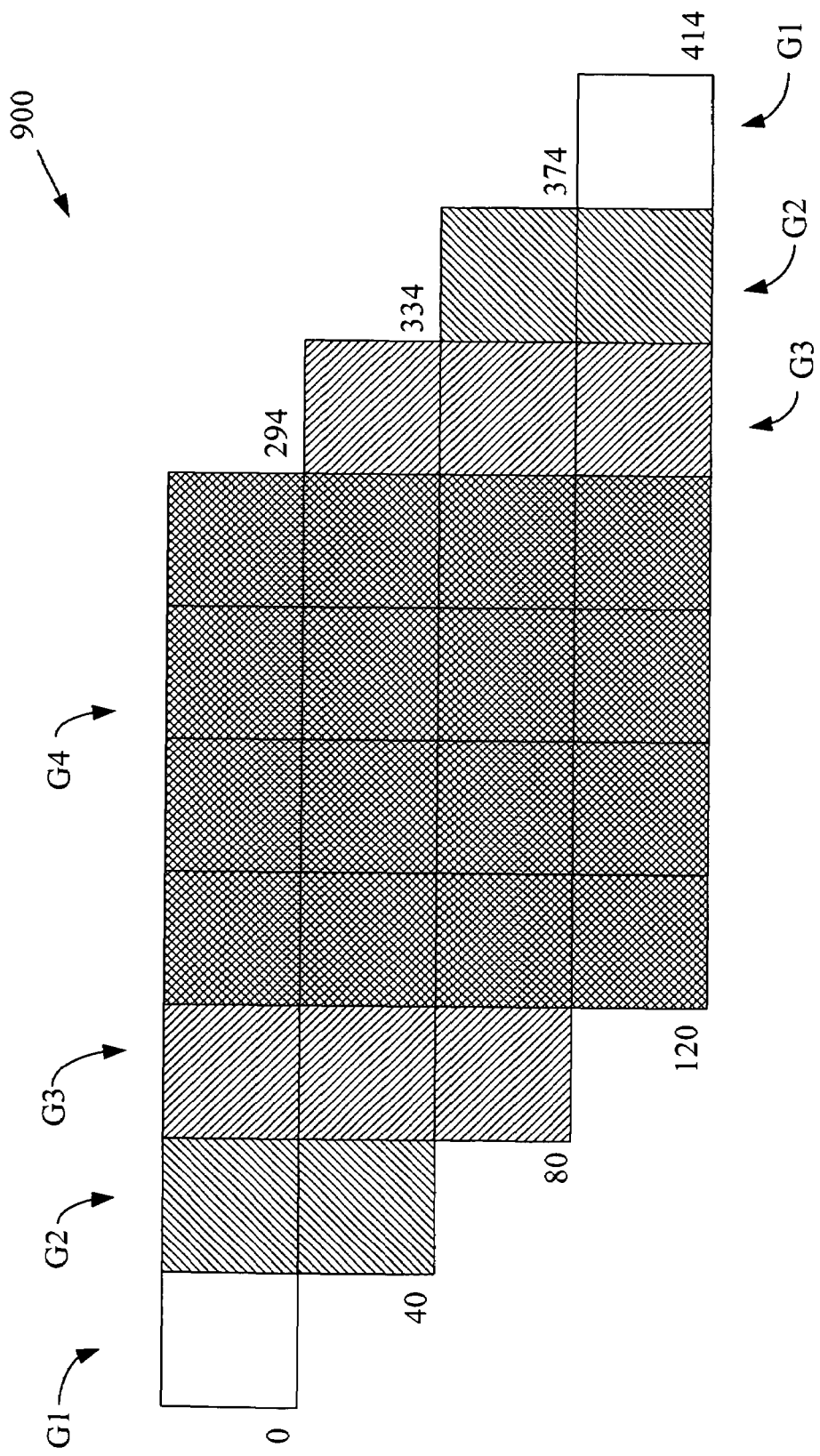
FIG. 9 conceptually illustrates one exemplary embodiment of a logical structure of a constant-folded circuit that may be used to implement the correlator shown in FIG. 7, in accordance with the present invention.

FIG. 9 conceptually illustrates one exemplary embodiment of a logical structure 900 of a constant-folded circuit that may be used to implement the correlator 700 shown in FIG. 7. In the illustrated embodiment, the logical structure 900 does not correspond to physical placement of the constant-folded circuit. In the illustrated embodiment, the DPSB length is extended from 256 to 295 cells to contain all data items concurrently. The DPSBs may also be aligned so that the same data items form a column. With the DPSBs aligned by common data items, the associated generator units may only perform the minimum number of evaluations. For example, the configuration for a particular data element typically must be produced for all four DPSBs. A single generator connected to all four cells may supply the configuration. In contrast, the conventional static implementation performs the basic generator computation many more times than necessary.

The various areas in the logical structure 900 having similar hatching indicate cell clustering around particular generator units. The label G1 (and no hatching) indicates that the generator associated with these cells feeds one cell per data item, so a G1 unit may configure 10 cells in approximately 40 cycles at 4 cycles per data item. The label G2 (and left-to-right hatching) indicates that the generator associated with these cells feeds two cells per data item, so a G2 unit may configure 20 cells in approximately 40 cycles at 4 cycles per data item. The label G3 (and right-to-left hatching) indicates that the generator associated with these cells feeds three cells per data item, so a G3 unit may configure 30 cells in approximately 40 cycles at 4 cycles per data item. The label G4 (and cross-hatching) indicates that the generator associated with these cells feeds four cells per data item, so a G4 unit may configure 40 cells in approximately 40 cycles at 4 cycles per data item. Accordingly, a constant folded implementation may reduce the resource requirements by over one third.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of operating a constant-folded circuit that is representative of at least one first circuit having at least one first input that varies on a relatively short time scale, at least one second input that varies on a relatively long time scale, and at least one output, comprising:

determining at least one first value of at least one output of the constant-folded circuit based on at least one first value of said at least one first input, the constant-folded circuit having been configured using first configuration information generated based on the first circuit and a plurality of possible values of said at least one first input, at least one first value of said at least one second input, and at least one first value of the output corresponding to the values of the first and second inputs; and generating, concurrently with determining said at least one first value of said at least one output, second configuration information for the constant-folded circuit based on the first circuit and the plurality of possible values of said at least one first input, at least one second value of said at least one second input, and at least one second value of the output corresponding to the values of the first and second inputs.

2. The method of claim 1, wherein said at least one first value of said at least one output of the constant-folded circuit corresponds to at least one value of said at least one output of the first circuit that would be generated by the first circuit in response to said at least one first value of said at least one first input and said at least one first value of said at least one second input.

3. The method of claim 1, wherein generating the second configuration information comprises generating the second configuration information using at least one generator function corresponding to the at least one first circuit.

4. The method of claim 3, wherein generating the second configuration information using said at least one generator function corresponding to said at least one first circuit comprises generating a lookup table using said at least one generator function.

5. The method of claim 4, wherein generating the lookup table using said at least one generator function comprises generating a plurality of entries in the lookup table using said at least one generator function, said at least one second value of said at least one second input, and the plurality of possible values of said at least one first input.

6. The method of claim 1, comprising providing the second configuration information to a configuration memory associated with the constant-folded circuit.

7. The method of claim 6, wherein providing the second configuration information to the configuration memory comprises providing the second configuration information to the configuration memory concurrently with determining said at least one first value of said at least one output of the constant-folded circuit.

8. The method of claim 6, comprising modifying at least one location of a portion of the first configuration information in the configuration memory in response to providing a portion of the second configuration information to the configuration memory.

9. The method of claim 1, comprising determining at least one second value of at least one output of the constant-folded circuit based on at least one second value of said at least one first input.

10. The method of claim 9, comprising generating, concurrently with determining said at least one second value of said at least one output of the constant-folded circuit, third configuration information using said at least one generator function corresponding to said at least one first circuit and at least one third value of said at least one second input.

11. A method involving a matched filter comprising at least one correlator that operates as a constant-folded circuit configured to correlate code sequences with a portion of a data stream that remains constant during a search window, comprising:

determining at least one first correlation value based on the portion of the code sequence and a first portion of the data stream using the correlator, the correlator having been configured using first configuration information generated based on the first portion of the data stream, the determination been performed during the search window; and generating, concurrently with determining said at least one first correlation value, second configuration information based on a second portion of the data stream.

12. The method of claim 11, wherein determining said at least one first correlation value comprises determining a plurality of first correlation values based on the portion of the code sequence and a plurality of first portions of the data stream using a plurality of correlators, each of the plurality of correlators having been configured using a plurality of first configuration information sets generated based on a corresponding one of the plurality of first portions of the data stream.

13. The method of claim 12, wherein generating the second configuration information comprises generating, concurrently with determining the plurality of first correlation values, a plurality of second configuration information sets based on a plurality of second portions of the data stream.

14. The method of claim 11, wherein generating the second configuration information comprises generating the second configuration information using at least one generator function corresponding to the correlator.

15. The method of claim 14, wherein generating the second configuration information using said at least one generator function corresponding to said at least one first circuit comprises generating at least one lookup table using said at least one generator function.

16. The method of claim 15, wherein generating said at least one lookup table using said at least one generator function comprises generating a plurality of entries in said at least one lookup table using said at least one generator function, said portion of the data stream, and a plurality of values of the portion of the code sequence.

17. The method of claim 11, comprising providing the second configuration information to a configuration memory associated with the correlator.

18. The method of claim 17, wherein providing the second configuration information to the configuration memory comprises providing the second configuration information to the configuration memory concurrently with determining said at least one first correlation value.

19. The method of claim 17, comprising modifying at least one location of a portion of the first configuration information in the configuration memory in response to providing the portion of the second configuration information to the configuration memory.

20. The method of claim 11, comprising determining at least one second correlation value based on a second portion of the data stream.

21. The method of claim 20, comprising generating, concurrently with determining said at least one second correlation value, third configuration information using said at least one generator function based on a third portion of the data stream.

* * * * *